(12) United States Patent
Kira et al.

(10) Patent No.: US 9,905,528 B2
(45) Date of Patent: Feb. 27, 2018

(54) SEMICONDUCTOR MOUNTING APPARATUS, HEAD THEREOF, AND METHOD FOR MANUFACTURING LAMINATED CHIP

(71) Applicant: FUJITSU LIMITED, Kawasaki-shi, Kanagawa (JP)

(72) Inventors: Hidehiko Kira, Nagano (JP); Takumi Masuyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/365,192

(22) Filed: Nov. 30, 2016

(65) Prior Publication Data

US 2017/0186721 A1    Jun. 29, 2017

(30) Foreign Application Priority Data

Dec. 28, 2015 (JP) ................ 2015-256807

(51) Int. Cl.
| | | |
|---|---|---|
| H01L 23/00 | (2006.01) | |
| H01L 25/065 | (2006.01) | |
| H01L 25/00 | (2006.01) | |

(52) U.S. Cl.
CPC .............. *H01L 24/75* (2013.01); *H01L 24/81* (2013.01); *H01L 25/0657* (2013.01); *H01L 25/50* (2013.01); *H01L 2224/75301* (2013.01); *H01L 2224/75745* (2013.01); *H01L 2224/81203* (2013.01); *H01L 2225/06513* (2013.01); *H01L 2225/06558* (2013.01)

(58) Field of Classification Search
CPC ....... H01L 2924/00; H01L 2924/00014; H01L 2224/32225
See application file for complete search history.

(56) References Cited

U.S. PATENT DOCUMENTS

| | | | |
|---|---|---|---|
| 6,176,966 B1 * | 1/2001 | Tsujimoto | H01L 21/67132 156/701 |
| 9,245,787 B2 * | 1/2016 | Jeon | H01L 21/6838 |
| 2002/0029857 A1 | 3/2002 | Yamada | |
| 2003/0148596 A1 | 8/2003 | Kellar et al. | |
| 2004/0240865 A1 * | 12/2004 | Bergmann | B23K 1/0056 392/418 |
| 2006/0016555 A1 | 1/2006 | Yamauchi et al. | |

(Continued)

FOREIGN PATENT DOCUMENTS

| | | |
|---|---|---|
| JP | 2-158150 A | 6/1990 |
| JP | 2000-332390 | 11/2000 |

(Continued)

OTHER PUBLICATIONS

Taiwanese Office Action dated Nov. 10, 2017 for corresponding Taiwanese Patent Application No. 105139519, with English Translation, 13 pages.

(Continued)

*Primary Examiner* — Jaehwan Oh
(74) *Attorney, Agent, or Firm* — Fujitsu Patent Center

(57) ABSTRACT

A semiconductor mounting apparatus includes a storing unit that stores a liquid or a gas, a contact unit that comes into contact with a semiconductor chip when the storing unit is filled with the liquid or the gas, and a sucking unit that sucks up the semiconductor chip to bring the semiconductor chip into close contact with the contact unit.

8 Claims, 13 Drawing Sheets

(56) References Cited

U.S. PATENT DOCUMENTS

| | | | | |
|---|---|---|---|---|
| 2007/0020800 A1* | 1/2007 | Ishikawa | .......... | G06K 19/07749 |
| | | | | 438/106 |
| 2007/0020801 A1* | 1/2007 | Ishikawa | .......... | G06K 19/07718 |
| | | | | 438/106 |
| 2008/0318346 A1* | 12/2008 | Maki | .................. | H01L 21/67132 |
| | | | | 438/7 |
| 2009/0023243 A1* | 1/2009 | Koyanagi | .............. | H01L 21/568 |
| | | | | 438/107 |
| 2010/0064510 A1 | 3/2010 | Narita et al. | | |
| 2011/0020983 A1* | 1/2011 | Tomura | .................. | H01L 21/563 |
| | | | | 438/108 |
| 2012/0252166 A1* | 10/2012 | Koyanagi | ............. | H01L 21/561 |
| | | | | 438/109 |
| 2016/0148819 A1* | 5/2016 | Heuck | .................. | H01L 21/4825 |
| | | | | 438/121 |

FOREIGN PATENT DOCUMENTS

| | | |
|---|---|---|
| JP | 2001-230528 | 8/2001 |
| JP | 2002-16108 A | 1/2002 |
| JP | 2011-066027 | 3/2011 |
| JP | 2015-018897 | 1/2015 |
| KR | 10-2012-0054758 A | 5/2012 |

OTHER PUBLICATIONS

Korean Office Action dated Jan. 3, 2018 for corresponding Korean Patent Application No. 10-2016-0161870, with English Translation, 15 pages.

* cited by examiner

HEATING + COMPRESSING

SEMICONDUCTOR MOUNTING APPARATUS, HEAD THEREOF, AND METHOD FOR MANUFACTURING LAMINATED CHIP

CROSS-REFERENCE TO RELATED APPLICATION

This application is based upon and claims the benefit of prior Japanese Patent Application No. 2015-256807 filed on Dec. 28, 2015, the entire contents of which are incorporated herein by reference.

FIELD

The present invention relates to a semiconductor mounting apparatus, a head thereof, and a method for manufacturing a laminated chip.

BACKGROUND

Processors and memories used in a high-end server or the like may, in some cases, use a laminated semiconductor chip in which a plurality of semiconductor chips are laminated for performance enhancement. As illustrated in FIG. 12, terminals (microbumps) 104 are formed on a semiconductor chip 101. The terminals 104 include copper columns (Cu posts or Cu pillars) 102 and solder 103 formed on top of copper columns 102. Thus, a method is used in which the terminals 104 of a plurality of semiconductor chips 101 are joined to laminate the plurality of semiconductor chips 101.

In order to ensure junction reliability after the plurality of semiconductor chips 101 are laminated, pasty or filmy reinforcing resin 105 is supplied onto each semiconductor chip 101, as illustrated in FIG. 13. Pasty reinforcing resin 105 is also referred to as NCP (Non-conductive Paste), whereas filmy reinforcing resin 105 is also referred to as an NCF (Non-conductive Film). As illustrated in FIG. 14, a semiconductor chip 101A is sucked from a suction hole 202 of a head 201 of a semiconductor mounting apparatus, such as a flip-chip bonder. A semiconductor chip 101B on which a plurality of terminals 104B are formed is disposed below the semiconductor chip 101A. Next, the semiconductor chip 101A is pressurized with the head 201, while heating the semiconductor chip 101A, to break through the reinforcing resin 105 by the terminals 104A of the semiconductor chip 101A, as illustrated in FIG. 15. The terminals 104A of the semiconductor chip 101A and the terminals 104B of the semiconductor chip 101B are thus joined to ensure electrical conduction between the semiconductor chip 101A and the semiconductor chip 101B and the rigidity of the chips.

[Patent document 1] Japanese Laid-open Patent Publication No. 2015-18897
[Patent document 2] Japanese Laid-open Patent Publication No. 2011-66027
[Patent document 3] Japanese Laid-open Patent Publication No. 2000-332390
[Patent document 4] Japanese Laid-open Patent Publication No. 2001-230528

SUMMARY

According to an aspect of the application, a semiconductor mounting apparatus includes: a storing unit that stores a liquid or a gas; a contact unit that comes into contact with a semiconductor chip when the storing unit is filled with the liquid or the gas; and a sucking unit that sucks up the semiconductor chip to bring the semiconductor chip into close contact with the contact unit.

According to an aspect of the application, a method for manufacturing a laminated chip, includes: disposing a head including a storing unit that stores a liquid or a gas, and a contact unit that comes into contact with a first semiconductor chip when the storing unit is filled with the liquid or the gas on the first semiconductor chip; filing the storing unit with the liquid or the gas; sucking up the first semiconductor chip to bring the first semiconductor chip into close contact with the contact unit; disposing a second semiconductor chip on the first semiconductor chip, so that a plurality of first terminals of the first semiconductor chip and a plurality of second terminals of the second semiconductor chip face each other; and heating the second semiconductor chip and pressurizing the first semiconductor chip with the head to join the plurality of first terminals and the plurality of second terminals.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENT

A thickness variation and warpage are present in the semiconductor chip 101A. Accordingly, it is difficult to apply an even pressure to the semiconductor chip 101A when the semiconductor chip 101A is pressurized with the head 201. When any uneven pressure is applied to the semiconductor chip 101A, the terminals 104A of the semiconductor chip 101A may fail to break through the reinforcing resin 105. Consequently, there may arise a failure in junction between the terminals 104A of the semiconductor chip 101A and the terminals 104B of the semiconductor chip 101B.

Figure 14:
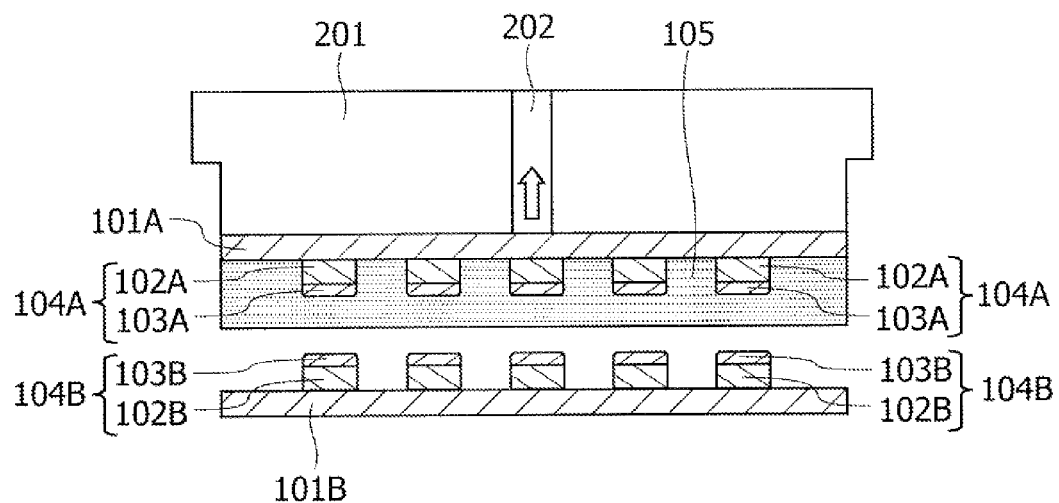
FIG. 14 is an explanatory view of a method for joining semiconductor chips.
Figure 15:
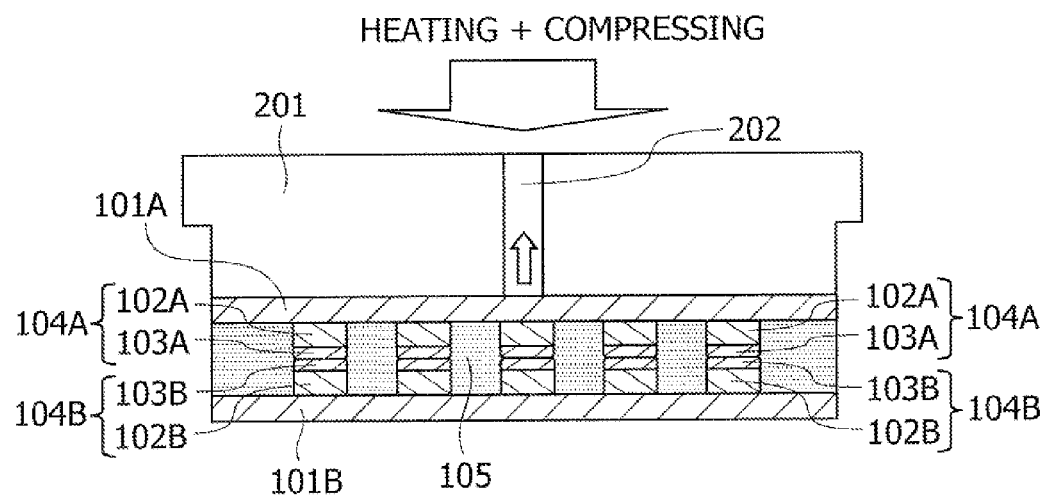
FIG. 15 is an explanatory view of a method for joining semiconductor chips.

When the semiconductor chip 101A has a finish as designed, the upper surface of the semiconductor chip 101A (a surface thereof opposite to the surface on which terminals are formed) is planar. In addition, when a plurality of terminals 104A formed on the semiconductor chip 101A have a finish as designed, the plurality of terminals 104A are aligned heightwise. When the upper surface of the semiconductor chip 101A is planar and the plurality of terminals 104A are aligned heightwise as illustrated in FIG. 14, the upper surfaces of the plurality of terminals 104A align parallel to one another even when the upper surface of the semiconductor chip 101A is sucked onto the head 201. The upper surfaces of the terminals 104A of the semiconductor chip 101A are opposed to the semiconductor chip 101B.

Figure 16:
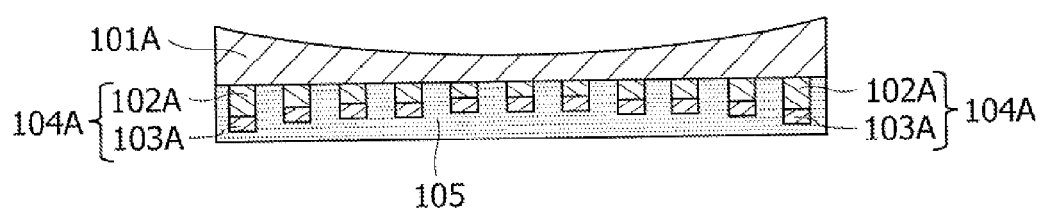
FIG. 16 is an explanatory view of a method for joining semiconductor chips.
Figure 17:
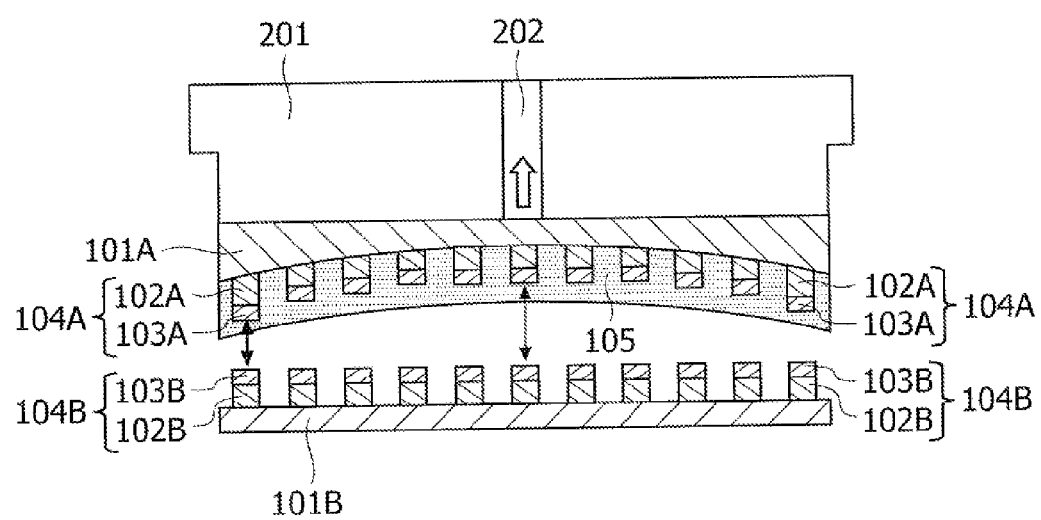
FIG. 17 is an explanatory view of a method for joining semiconductor chips.

As illustrated in FIG. 16, there are a thickness variation in the semiconductor chip 101A, a height variation in the terminals 104A, and warpage in the semiconductor chip 101A. As illustrated in FIG. 17, the upper surface of the semiconductor chip 101A, when sucked onto the head 201, is planarized. The upper surfaces of the plurality of terminals 104A do not align parallel to one another, however. Consequently, the distance between the terminals 104A of the semiconductor chip 101A and the terminals 104B of the semiconductor chip 101B differs between the central portion and outer peripheral portion of the semiconductor chip 101A.

When the external size of the semiconductor chip 101A is 10 mm square or smaller, the difference between the central portion and outer peripheral portion of the semiconductor chip 101A is small in the distance between the terminals 104A of the semiconductor chip 101A and the terminals 104B of the semiconductor chip 101B. Accordingly, the terminals 104A of the semiconductor chip 101A and the terminals 104B of the semiconductor chip 101B can be joined as the result of the solder 103A of the terminals 104A being collapsed.

On the other hand, the difference between the central portion and outer peripheral portion of the semiconductor chip 101A is large in the distance between the terminals 104A of the semiconductor chip 101A and the terminals 104B of the semiconductor chip 101B, when the external size of the semiconductor chip 101A is 20 mm square or larger. All of the plurality of terminals 104A of the semiconductor chip 101A therefore are not joinable to the plurality of terminals 104B of the semiconductor chip 101B even when a pressure (load) on the semiconductor chip 101A is increased, as long as the head 201 adsorbs the semiconductor chip 101A with the upper surface thereof kept planar. In addition, a pressure used to join the terminals 104A of the semiconductor chip 101A and the terminals 104B of the semiconductor chip 101B increases in proportion to the size of the semiconductor chip 101A. Accordingly, simply increasing the pressure may cause physical disruption to the semiconductor chip 101A.

Hereinafter, embodiments will be described in detail with reference to the drawings. The configurations of the embodiments are merely examples, and therefore, the application is not limited to these configurations of the embodiments.

Figure 1:
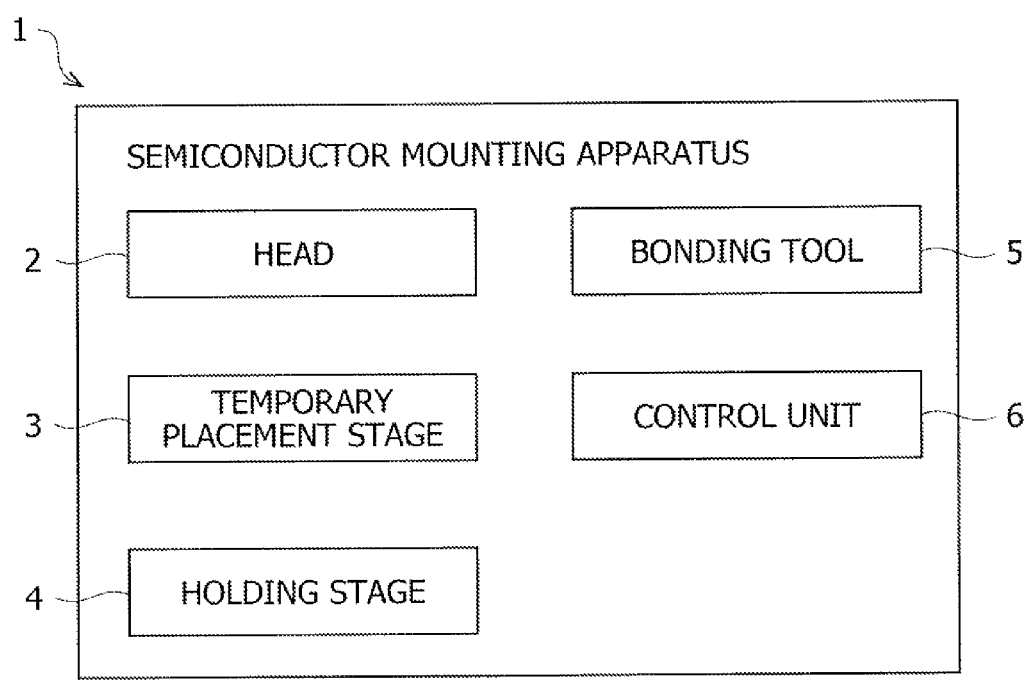
FIG. 1 is a configuration diagram of a semiconductor mounting apparatus.

FIG. 1 is a configuration diagram of a semiconductor mounting apparatus 1. The semiconductor mounting apparatus 1 is also referred to as a flip-chip bonder. The semiconductor mounting apparatus 1 includes a head 2, a temporary placement stage 3, a holding stage 4, a bonding tool 5 and a control unit 6. The head 2 is attached to the bonding tool 5 and is, for example, raised, lowered, and moved parallel by the bonding tool 5. The temporary placement stage 3 is a stage on which an upper-side semiconductor chip, when held with the head 2, is temporarily placed. When a plurality of semiconductor chips are laminated, the uppermost of the laminated semiconductor chips is held by the head 2, whereas the lowermost of the laminated semiconductor chips is held by the holding stage 4. In addition, the holding stage 4 heats the lowermost semiconductor chip.

The control unit 6 includes an unillustrated central processing unit (CPU) and a memory to control operations and processes undertaken by the head 2, the temporary placement stage 3, the holding stage 4 and the bonding tool 5 according to a computer program executably deployed in this memory. The CPU is also referred to as a processor. The CPU is not limited to a single processor, however, but may be a multiprocessor. The memory includes, for example, a ROM (Read Only Memory) and a RAM (Random Access Memory).

Figure 2:
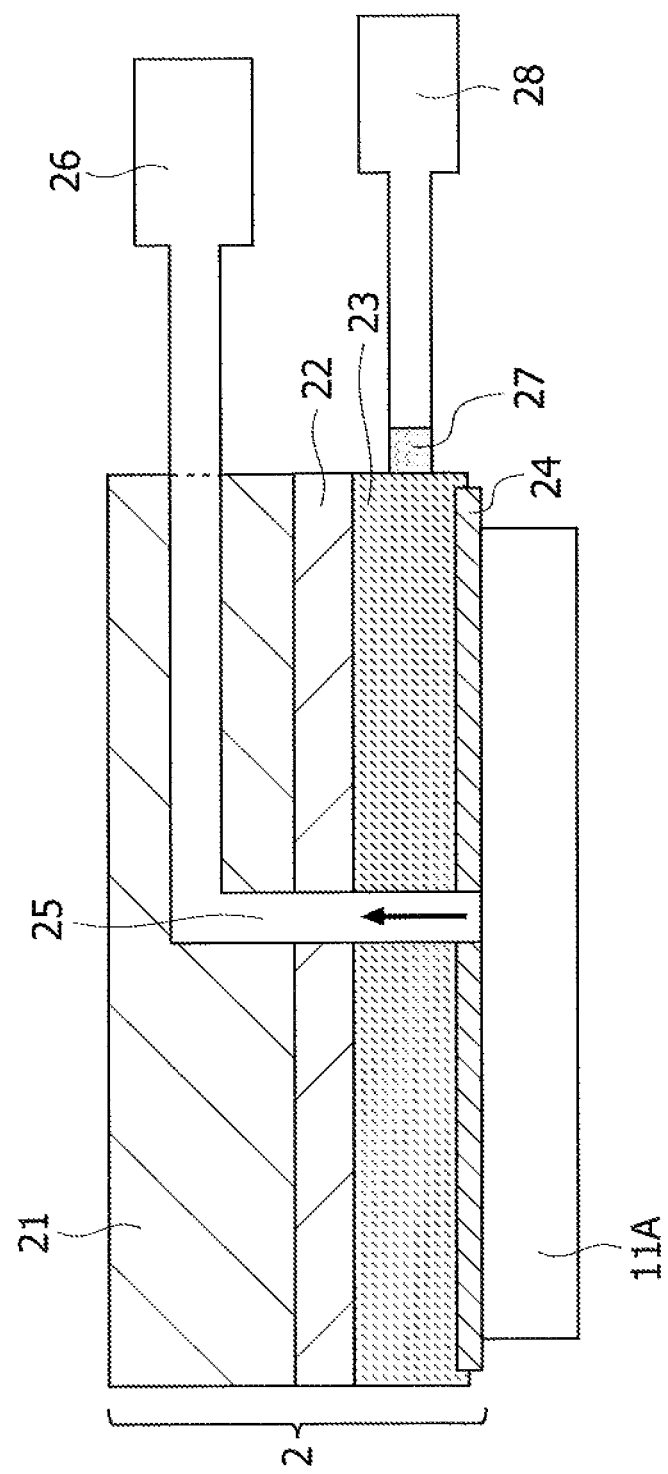
FIG. 2 is a cross-sectional view of a head.

FIG. 2 is a cross-sectional view of the head 2. The head 2 includes a supporting unit 21, a heater 22, a diaphragm 23, an elastic body 24, and a suction hole 25. The supporting unit 21 supports the heater 22, the diaphragm 23 and the elastic body 24. Openings are formed in the bottom and side surfaces of the head 2. The suction hole 25 passes through the supporting unit 21, the heater 22, the diaphragm 23 and the elastic body 24 to connect to the openings formed in the bottom and side surfaces of the head 2. A suction unit (suction mechanism) 26 is connected to the opening formed in the side surface of the head 2. Accordingly, the suction hole 25 is connected to the suction unit 26. The suction unit 26 is driven to suck the semiconductor chip 11A from the suction hole 25, thus causing the semiconductor chip 11A to adsorb onto the bottom surface of the head 2. The suction unit 26 is, for example, a vacuum suction pump.

In the structural example of the head 2 illustrated in FIG. 2, the head 2 includes one suction hole 25. The head 2 is not limited to the structural example illustrated in FIG. 2, however. The head 2 may include a plurality of suction holes 25. In this case, each of the plurality of suction holes 25 is connected to the suction unit 26. For example, at least one suction hole 25 located in the central portion of the head 2 may suck the central portion of the semiconductor chip 11A, and at least one suction hole 25 located in the outer peripheral portion of the head 2 may suck the outer peripheral portion of the semiconductor chip 11A. In the structural example of the head 2 illustrated in FIG. 2, the suction unit 26 is disposed externally to the head 2. The head 2 is not limited to the structural example illustrated in FIG. 2, however. The suction unit 26 may be disposed inside the head 2. Accordingly, the head 2 may include the suction unit 26.

The heater 22 is a heating unit (heating mechanism). The heater 22 heats the semiconductor chip 11A. Heat generated by the heater 22 transfers to the semiconductor chip 11A through the diaphragm 23 and the elastic body 24. The diaphragm 23 and the elastic body 24 therefore preferably have high heat resistance. For example, the diaphragm 23 and the elastic body 24 may have a heat resistance of 200° C. or higher.

A liquid or a gas is supplied from a supply unit (feeding mechanism) 28 into the diaphragm 23 through a valve 27 disposed on a side surface of the diaphragm 23. The diaphragm 23 thus stores the liquid or the gas. The liquid stored (filled) in the diaphragm 23 is, for example, a fusible alloy or oil. The gas stored (filled) in the diaphragm 23 is, for example, air. The diaphragm 23 is formed of an elastic material. The elastic body 24 is located on the bottom of the diaphragm 23. The elastic body 24 is, for example, silicon rubber. The diaphragm 23 deforms according to the amount (volume, pressure, or the like) of liquid or gas filled in the diaphragm 23. The elastic body 24 deforms according to the deformation of the diaphragm 23. That is, the diaphragm 23 deforms according to the amount of liquid or gas filled in the diaphragm 23, and so does the elastic body 24. The diaphragm 23 is one example of a storing unit. The elastic body 24 is one example of a contact unit.

<Support of Semiconductor Chip>

Figure 3:
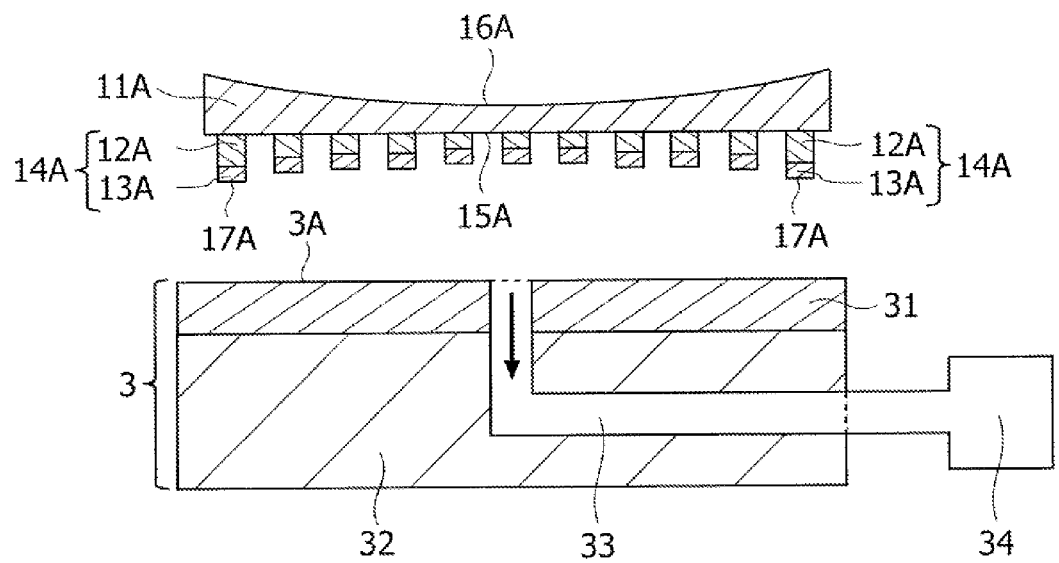
FIG. 3 is a cross-sectional view of a temporary placement stage.
Figure 4:
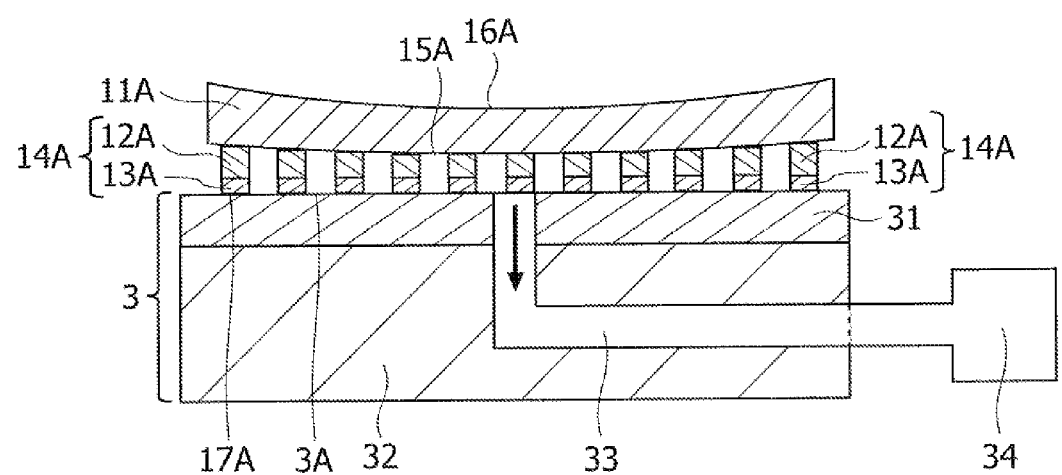
FIG. 4 is a cross-sectional view of a temporary placement stage.

Support of the semiconductor chip 11A by the head 2 will be described with reference to FIGS. 3 to 8. FIGS. 3 and 4 are cross-sectional views of the temporary placement stage 3. The temporary placement stage 3 is a stage on which the semiconductor chip 11A is temporarily placed before being held by the head 2. The temporary placement stage 3 includes a stage (board) 31, a supporting unit 32, and a suction hole 33. The supporting unit 32 supports the stage 31. The temporary placement stage 3 also includes a mounting surface 3A on which the semiconductor chip 11A is placed. Openings are formed in the mounting surface 3A and a side surface of the temporary placement stage 3. The suction hole 33 passes through the stage 31 and the supporting unit 32 to connect to the openings formed in the mounting surface 3A and the side surface of the temporary placement stage 3. A suction unit (suction mechanism) 34 is connected to the opening formed in the side surface of the temporary placement stage 3. Accordingly, the suction hole 33 is connected to the suction unit 34. The suction unit 34 is, for example, a vacuum suction pump.

Terminals (microbumps) 14A are formed on the semiconductor chip 11A. The terminals 14A include copper columns (Cu posts or Cu pillars) 12A and solder 13A formed on top of copper columns 12A. The semiconductor chip 11A includes a plurality of terminals 14A, a surface (terminal-formed surface) 15A on which the plurality of terminals 14A are formed, and a surface (back surface) 16A opposed to the terminal-formed surface 15A. The back surface 16A of the semiconductor chip 11A illustrated in FIG. 3 has a concave circular-arc shape, and the plurality of terminals 14 of the semiconductor chip 11A do not align heightwise. Accordingly, the upper surfaces 17A of the plurality of terminals 14 of the semiconductor chip 11A do not align parallel to one another. The upper surfaces 17A of the terminals 14A of the semiconductor chip 11A and the terminal-formed surface 15A face in the same direction and are opposed to the mounting surface 3A of the temporary placement stage 3 in FIG. 3. The suction unit 34 is driven to suck the terminal-formed surface 15A of the semiconductor chip 11A from the suction hole 33, thus causing the semiconductor chip 11A to be adsorbed onto the mounting surface 3A of the temporary placement stage 3. Suction by the suction unit 34 may be performed before the semiconductor chip 11A is placed on the mounting surface 3A of the temporary placement stage 3. Alternatively, suction by the suction unit 34 may be performed after the semiconductor chip 11A is placed on the mounting surface 3A of the temporary placement stage 3.

The suction unit 34 sucks the semiconductor chip 11A from the terminal-formed surface 15A side of the semiconductor chip 11A, so that the distance between each of the upper surfaces 17A of the plurality of terminals 14A and the mounting surface 3A of the temporary placement stage 3 is the same. The strength of suction by the suction unit 34 is controlled by the control unit 6. As the result of the semiconductor chip 11A being sucked from the terminal-formed surface 15A side of the semiconductor chip 11A, as illustrated in FIG. 4, the upper surfaces 17A of the plurality of terminals 14A align parallel to one another. Since the upper surfaces of the plurality of terminals 14A align parallel to one another in FIG. 4, all of the plurality of terminals 14A are in contact with the mounting surface 3A of the temporary placement stage 3.

Figure 5:
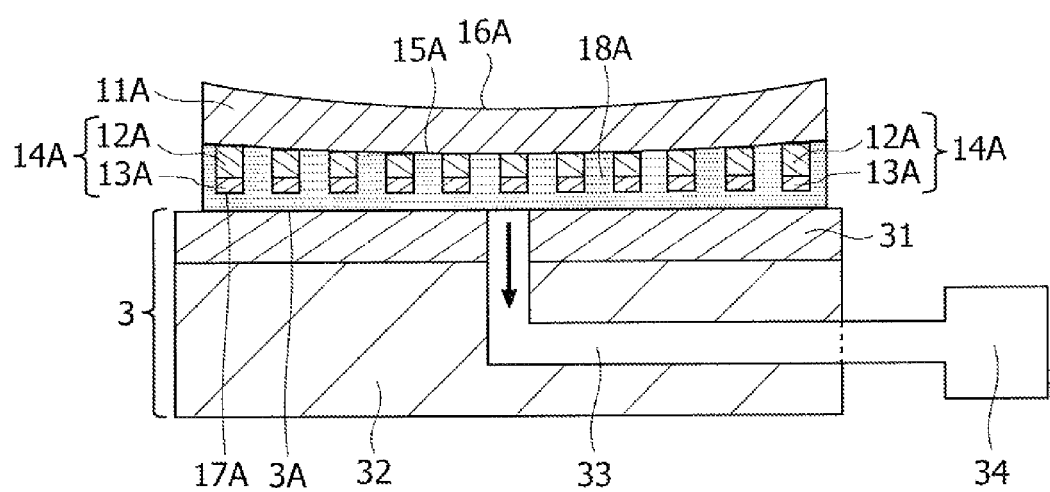
FIG. 5 is a cross-sectional view of a temporary placement stage.

FIGS. 3 and 4 illustrate an example in which reinforcing resin is not formed on the terminal-formed surface 15A of the semiconductor chip 11A. Alternatively, reinforcing resin 18A may be formed on the terminal-formed surface 15A of the semiconductor chip 11A, as illustrated in FIG. 5. FIG. 5 is a cross-sectional view of the temporary placement stage 3. The reinforcing resin 18A is a filmy NCF. The suction unit 34 sucks the semiconductor chip 11A and the reinforcing resin 18A from the terminal-formed surface 15A side of the semiconductor chip 11A, so that the distance between each of the upper surfaces 17A of the plurality of terminals 14A and the mounting surface 3A of the temporary placement stage 3 is the same. The strength of suction by the suction unit 34 is controlled by the control unit 6. As the result of the semiconductor chip 11A and the reinforcing resin 18A being sucked from the terminal-formed surface 15A side of the semiconductor chip 11A, as illustrated in FIG. 5, the upper surfaces 17A of the plurality of terminals 14A align parallel to one another.

In the structural examples of the temporary placement stage 3 illustrated in FIGS. 3 to 5, the temporary placement stage 3 includes one suction hole 33. The temporary placement stage 3 is not limited to the structural examples illustrated in FIGS. 3 to 5, however. The temporary placement stage 3 may include a plurality of suction holes 33. In this case, each of the plurality of suction holes 33 is connected to the suction unit 34. For example, at least one suction hole 33 located in the central portion of the temporary placement stage 3 may suck the central portion of the semiconductor chip 11A, and at least one suction hole 33 located in the outer peripheral portion of the temporary placement stage 3 may suck the outer peripheral portion of the semiconductor chip 11A. In the structural examples of the temporary placement stage 3 illustrated in FIGS. 3 to 5, the suction unit 34 is disposed externally to the temporary placement stage 3. The temporary placement stage 3 is not limited to the structural examples illustrated in FIGS. 3 to 5, however. The suction unit 34 may be disposed inside the temporary placement stage 3. Accordingly, the temporary placement stage 3 may include the suction unit 34.

Figure 6:
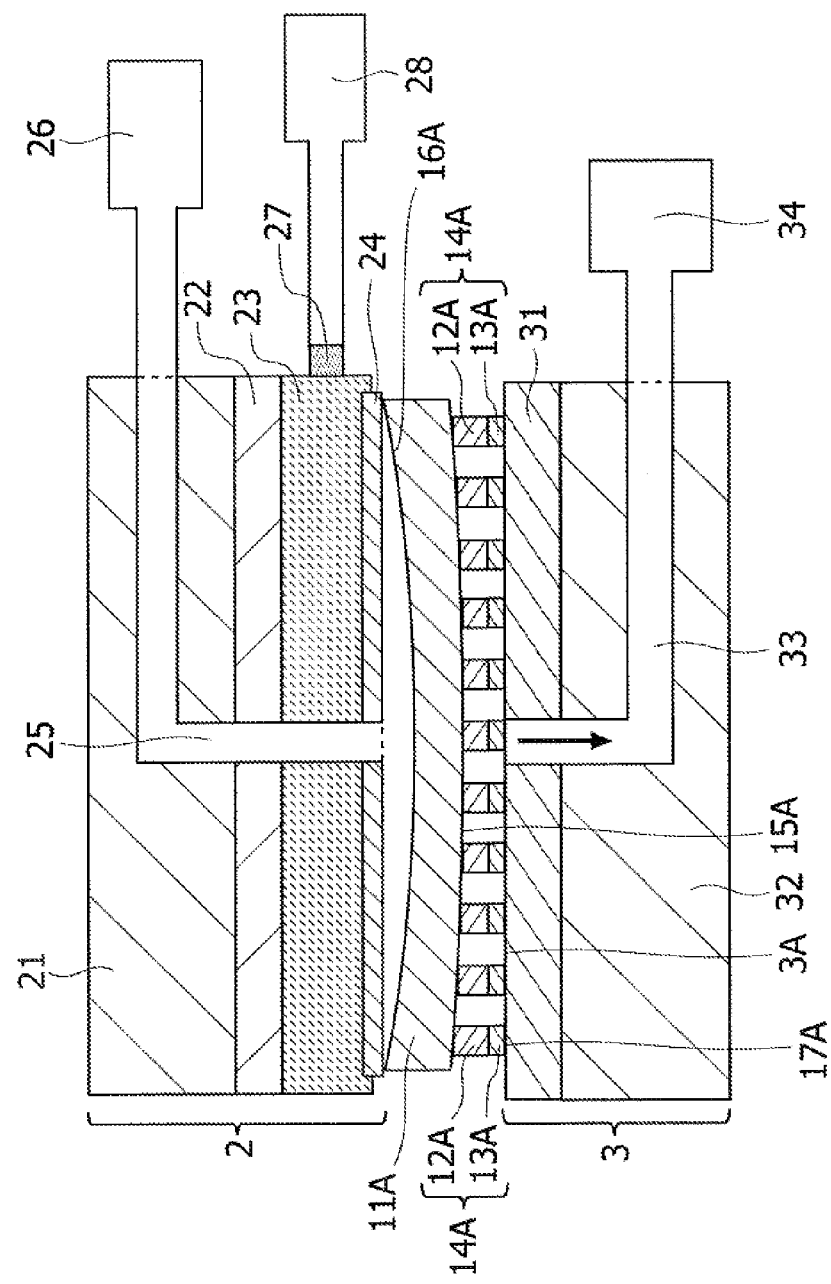
FIG. 6 is a cross-sectional view of a head and a temporary placement stage.

The head 2 is lowered by the bonding tool 5, while maintaining the condition of the semiconductor chip 11A being adsorbed onto the mounting surface 3A of the temporary placement stage 3, until immediately before the head 2 comes into contact with the semiconductor chip 11A. As illustrated in FIG. 6, the head 2 is lowered to dispose the head 2 on the semiconductor chip 11A. Accordingly, the diaphragm 23 and the elastic body 24 are disposed on the back surface 16A of the semiconductor chip 11A. Note that the reinforcing resin 18A may be formed on the terminal-formed surface 15A of the semiconductor chip 11A.

Figure 7:
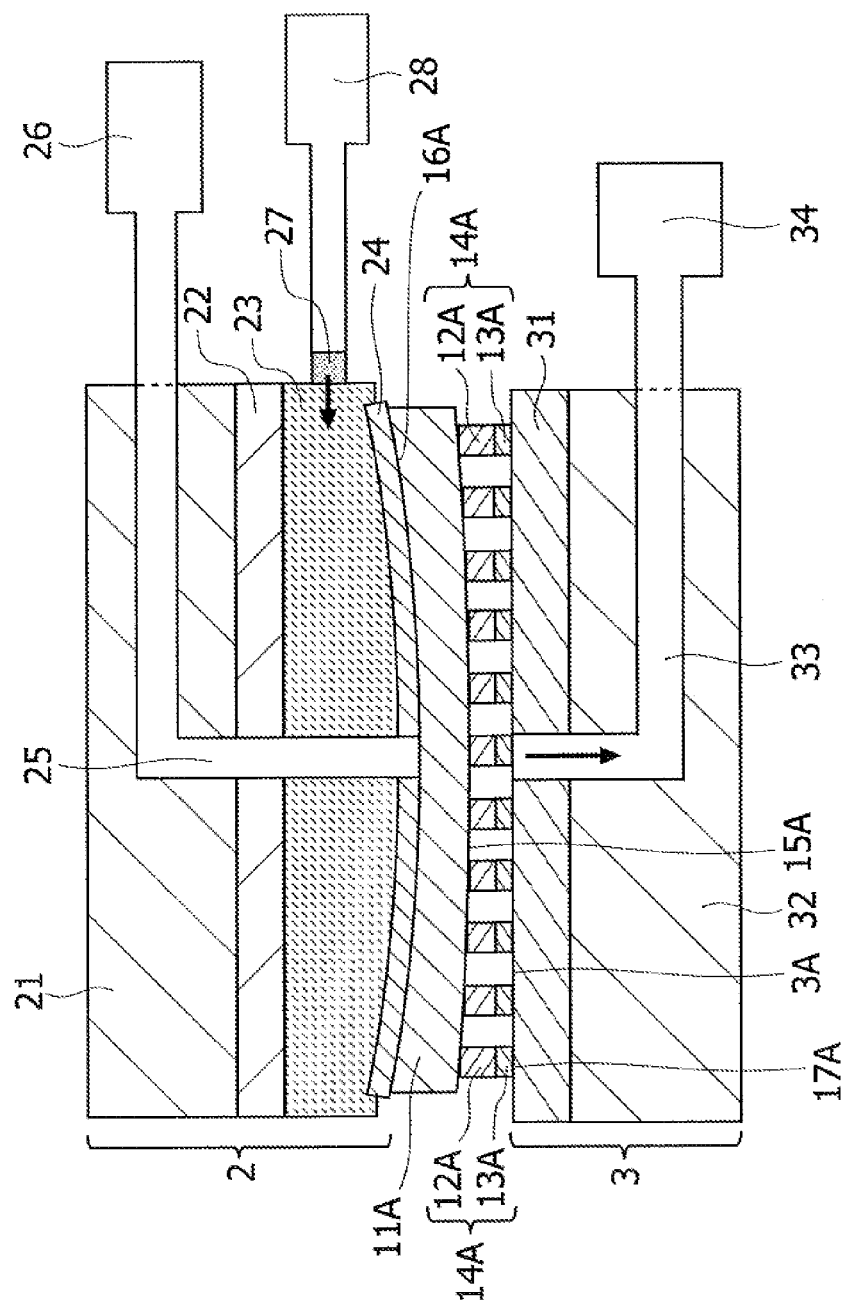
FIG. 7 is a cross-sectional view of a head and a temporary placement stage.

Next, the valve 27 disposed on the side surface of the diaphragm 23 is opened to supply a liquid or a gas from the supply unit 28 into the diaphragm 23 to fill the diaphragm 23 with the liquid or the gas. As illustrated in FIG. 7, the central portion of the diaphragm 23 swells toward the semiconductor chip 11A when the diaphragm 23 is filled with the liquid or gas. Consequently, the central portion of the elastic body 24 warps toward the semiconductor chip 11A, thus causing the elastic body 24 to come into contact with the back surface 16A of the semiconductor chip 11A. As described above, the diaphragm 23 and the elastic body 24 deform when the diaphragm 23 is filled with the liquid or gas, thus causing the elastic body 24 to come into contact with the back surface 16A of the semiconductor chip 11A. When the elastic body 24 comes into contact with the back surface 16A of the semiconductor chip 11A, the diaphragm 23 and the elastic body 24 deform according to the shape of the back surface 16A of the semiconductor chip 11A. For example, when the back surface 16A of the semiconductor chip 11A has a concave circular-arc shape, the diaphragm 23 and the elastic body 24 deform into a concave circular-arc shape in conformity with the back surface 16A of the semiconductor chip 11A.

When the elastic body 24 deforms according to the shape of the back surface 16A of the semiconductor chip 11A, the valve 27 disposed on the side surface of the diaphragm 23 is closed to prevent the amount of liquid or gas filled in the diaphragm 23 from varying. The opening and closure of the valve 27 is controlled by the control unit 6. For example, the amount of liquid or gas filled in the diaphragm 23 may be adjusted to close the valve 27 disposed on the side surface of the diaphragm 23, when a target amount of filling is reached. Alternatively, an amount of filling when the diaphragm 23 and the elastic body 24 deform according to the shape of the back surface 16A of the semiconductor chip 11A may be defined as the target amount of filling. Data on the target amount of filling is stored in the control unit 6.

Next, the suction unit 26 performs suction to suck up the semiconductor chip 11A from the suction hole 25. Consequently, the back surface 16A of the semiconductor chip 11A adsorbs to the elastic body 24, and therefore, the elastic body 24 and the back surface 16A of the semiconductor chip 11A come into close contact with each other. Accordingly, the back surface 16A of the semiconductor chip 11A comes into close contact with the elastic body 24 under the condition of the diaphragm 23 and the elastic body 24 having deformed according to the shape of the back surface 16A of the semiconductor chip 11A. The suction unit 26 is one example of a sucking unit. Although the back surfaces 16A of the semiconductor chips 11A illustrated in FIGS. 3 to 7 have a concave circular-arc shape, the back surface 16A of each semiconductor chip 11A may, in some cases, have a convex circular-arc shape. Even when the back surface 16A of the semiconductor chip 11A has a convex circular-arc shape, the diaphragm 23 and the elastic body 24 deform according to the shape of the back surface 16A of the semiconductor chip 11A. The elastic body 24 and the back surface 16A of the semiconductor chip 11A, therefore, come into close contact with each other. For example, when the back surface 16A of the semiconductor chip 11A has a convex circular-arc shape, the diaphragm 23 and the elastic body 24 deform into a convex circular-arc shape in conformity with the back surface 16A of the semiconductor chip 11A.

Figure 8:
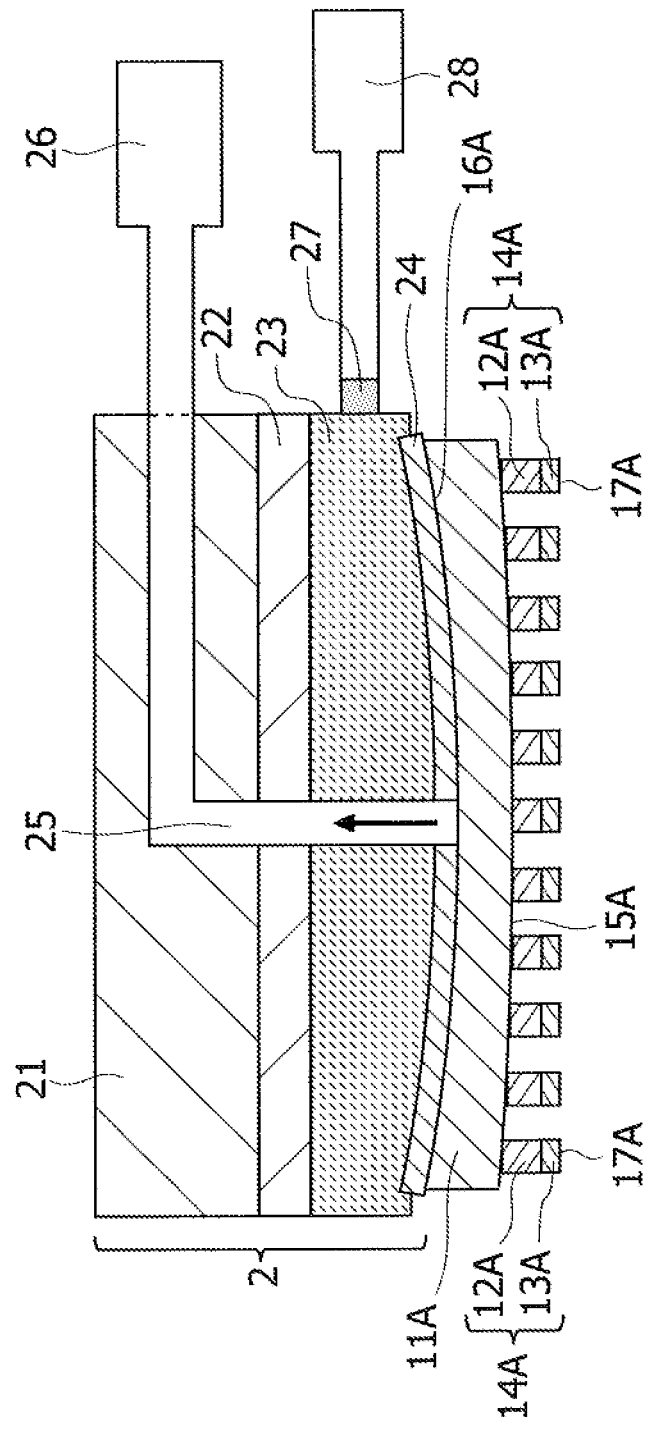
FIG. 8 is a cross-sectional view of a head.

Subsequently, the head 2 is raised by the bonding tool 5 to lift up the semiconductor chip 11A placed on the temporary placement stage 3. As illustrated in FIG. 8, the elastic body 24 and the back surface 16A of the semiconductor chip 11A are kept in close contact with each other even when the semiconductor chip 11A is moved away from the temporary placement stage 3. As a result, the back surface 16A of the semiconductor chip 11A adsorbs to the elastic body 24 under the condition of the upper surfaces 17A of the plurality of terminals 14A aligning parallel to one another. Note that a suction process by the suction unit 34 may be stopped when lifting up the semiconductor chip 11A.

A variation may occur in the thickness and warpage of the semiconductor chip 11A for each wafer lot. In addition, the height of each terminal 14 may vary. According to the semiconductor mounting apparatus 1 and the head 2 in accordance with the embodiments, the elastic body 24 varies in shape in conformity with the shape of the back surface 16A of the semiconductor chip 11A with the upper surfaces 17A of the plurality of terminals 14A aligning parallel to one another. Accordingly, it is possible to maintain the condition of the elastic body 24 and the back surface 16A of the semiconductor chip 11A being in close contact with each other, while maintaining the condition of the upper surfaces 17A of the plurality of terminals 14A aligning parallel to one another. Consequently, even when a wafer lot or chip specifications are changed, the head 2 can hold the semiconductor chip 11A under the condition of the upper surfaces 17A of the plurality of terminals 14A aligning parallel to one another, without the need to replace the head 2, the bonding tool 5, or the like.

In the structural examples of the head 2 illustrated in FIGS. 2 and 6 to 8, the elastic body 24 is disposed on the bottom of the diaphragm 23. The head 2 is not limited to the structural examples illustrated in FIGS. 2 and 6 to 8, however. The elastic body 24 need not be arranged in the head 2. Even in this case, the diaphragm 23 deforms according to the shape of the back surface 16A of the semiconductor chip 11A, and therefore, the diaphragm 23 and the back surface 16A of the semiconductor chip 11A come into close contact with each other. Consequently, the head 2 can hold the semiconductor chip 11A under the condition of the upper surfaces 17A of the plurality of terminals 14A aligning parallel to one another. The diaphragm 23 and the elastic body 24 may be integrated with each other.

<Method for Manufacturing Laminated Chip>

A method for manufacturing a laminated chip (semiconductor device) will be described with reference to FIGS. 9 to 11. In the method for manufacturing a laminated chip, a process in which the head 2 holds the semiconductor chip 11A is the same as the process described with reference to FIGS. 3 to 8, and therefore, will not be discussed here. Accordingly, processes subsequent to the process in which the head 2 holds the semiconductor chip 11A will be discussed here.

Figure 9:
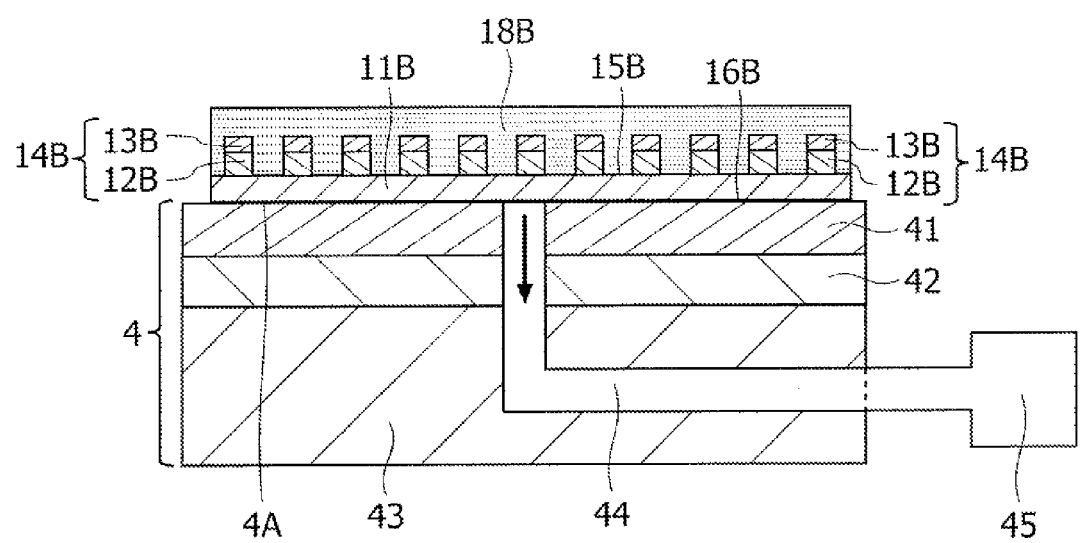
FIG. 9 is a process diagram of a method for manufacturing a laminated chip.

As illustrated in FIG. 9, a semiconductor chip 11B is placed on the holding stage 4. FIG. 9 is a cross-sectional view of the holding stage 4. The holding stage 4 includes a stage (board) 41, a heater 42, a supporting unit 43, and a suction hole 44. The holding stage 4 is one example of a heating stage. The supporting unit 43 supports the stage 41 and the heater 42. The holding stage 4 also includes a mounting surface 4A on which the semiconductor chip 11B is placed. Openings are formed in the mounting surface 4A and a side surface of the holding stage 4. The suction hole 44 passes through the stage 41, the heater 42 and the supporting unit 43 to connect to the openings formed in the mounting surface 4A and the side surface of the holding stage 4. A suction unit (suction mechanism) 45 is connected to the opening formed in the side surface of the holding stage 4. Accordingly, the suction hole 44 is connected to the suction unit 45. The suction unit 45 is, for example, a vacuum suction pump.

Terminals (microbumps) 14B are formed on the semiconductor chip 11B. The terminals 14B include copper columns 12B and solder 13B formed on top of copper columns 12B.

In addition, reinforcing resin 18B is formed on the semiconductor chip 11B. The reinforcing resin 18B may be either a filmy NCF or pasty NCP. When the reinforcing resin 18A is formed on the semiconductor chip 11A, the reinforcing resin 18B need not be formed on the semiconductor chip 11B. The semiconductor chip 11B includes a plurality of terminals 14B, a surface (terminal-formed surface) 15B on which the plurality of terminals 14B are formed, and a surface (back surface) 16B opposed to the terminal-formed surface 15B. The semiconductor chip 11B is held on the holding stage 4, so that the back surface 16B of the semiconductor chip 11B and the mounting surface 4A of the holding stage 4 face each other.

The suction unit 45 is driven to suck the semiconductor chip 11B from the suction hole 44, thus causing the semiconductor chip 11B to adsorb onto the mounting surface 4A of the holding stage 4. Suction by the suction unit 45 may be performed before the semiconductor chip 11B is placed on the mounting surface 4A of the holding stage 4. Alternatively, suction by the suction unit 45 may be performed after the semiconductor chip 11B is placed on the mounting surface 4A of the holding stage 4. Note that the process of holding the semiconductor chip 11B illustrated in FIG. 9 may be carried out before the process of holding the semiconductor chip 11A.

Next, the head 2 is moved by the bonding tool 5 to locate the semiconductor chip 11A above the semiconductor chip 11B. In this case, the semiconductor chip 11A is located so that the terminal-formed surface 15A of the semiconductor chip 11A and the terminal-formed surface 15B of the semiconductor chip 11B face each other as illustrated in FIG. 10. Subsequently, the semiconductor chip 11A and the semiconductor chip 11B are aligned using an unillustrated recognition camera. As the result of the semiconductor chip 11A and the semiconductor chip 11B being aligned, the plurality of terminals 14A of the semiconductor chip 11A and the plurality of terminals 14B of the semiconductor chip 11B face each other. Then, the head 2 is lowered by the bonding tool 5. A load is applied to the semiconductor chip 11A as the head 2 is lowered to perform a pressurization treatment on the semiconductor chip 11A. An even pressure can be applied to the semiconductor chip 11A since the elastic body 24 and the back surface 16A of the semiconductor chip 11A are in close contact with each other.

The heaters 22 and 42 start a heating treatment when a pressurization treatment is performed on the semiconductor chip 11A by the head 2. The heating temperature of the heater 42 is raised to perform the heating treatment on the semiconductor chip 11B. That is, heat generated by the heater 42 transfers to the stage 41 to heat the semiconductor chip 11B. As the result of the semiconductor chip 11B being heated, heat transfers from the semiconductor chip 11B to the reinforcing resin 18B. As the result of the reinforcing resin 18B being heated, the reinforcing resin 18B softens. As the result of the semiconductor chip 11A being pressurized with the reinforcing resin 18B softened, the terminals 14A of the semiconductor chip 11A become buried in the reinforcing resin 18B to break through the reinforcing resin 18B. An even pressure can be applied to the semiconductor chip 11A since the elastic body 24 and the back surface 16A of the semiconductor chip 11A are in close contact with each other. As a result, the terminals 14A of the semiconductor chip 11A can easily break through the reinforcing resin 18B. As the result of the terminals 14A of the semiconductor chip 11A breaking through the reinforcing resin 18B, the terminals 14A of the semiconductor chip 11A and the terminals 14B of the semiconductor chip 11B come into contact with each other, as illustrated in FIG. 11.

The heating temperature of the heater 22 is raised to perform a heating treatment on the semiconductor chip 11A. The heating treatment is performed on the semiconductor chip 11A by the heater 22, in order to prevent heat transferred from the heater 42 to the semiconductor chip 11B and the reinforcing resin 18B from being dissipated through the semiconductor chip 11A. That is, the heater 22 performs heat retention on the semiconductor chip 11A. The heating treatment performed on the semiconductor chip 11A by the heater 22 may cause the amount of liquid or gas filled in the diaphragm 23 to vary. In this case, the valve 27 disposed on the side surface of the diaphragm 23 may be opened or closed to adjust the amount of liquid or gas filled in the diaphragm 23. Alternatively, a heat-insulating material may be disposed between the supporting unit 21 and the diaphragm 23 in place of the heater 22.

The pressurization treatment of the semiconductor chip 11A may be started after the heating treatment of the semiconductor chips 11A and 11B is started. Alternatively, the heating treatment of the semiconductor chips 11A and 11B may be started after the pressurization treatment of the semiconductor chip 11A is started. In this way, the starting points of the heating treatment of the semiconductor chips 11A and 11B and the pressurization treatment of the semiconductor chip 11A may be made different from each other. Yet alternatively, the pressurization treatment of the semiconductor chip 11A and the heating treatment of the semiconductor chip 11B may be started at the same time. Still alternatively, the starting point of the heating treatment of the semiconductor chip 11A and the starting point of the heating treatment of the semiconductor chip 11B may be made different from each other. Still alternatively, the heating treatment of the semiconductor chip 11A and the heating treatment of the semiconductor chip 11B may be started at the same time.

The heater 42 raises the heating temperature of the solder 13A and 13B up to the melting temperature thereof. The solder 13A and 13B join together by being thus melted. As a result, the terminals 14A of the semiconductor chip 11A and the terminals 14B of the semiconductor chip 11B are joined, thereby ensuring electrical conduction between the semiconductor chip 11A and the semiconductor chip 11B and the rigidity of the chips. The laminated chip provided with the semiconductor chips 11A and 11B is manufactured in this way.

The reinforcing resin 18A and 18B need not be formed. In this case, an underfill is filled between the semiconductor chip 11A and the semiconductor chip 11B using a dispenser, after the terminals 14A of the semiconductor chip 11A and the terminals 14B of the semiconductor chip 11B are joined.

Figure 10:
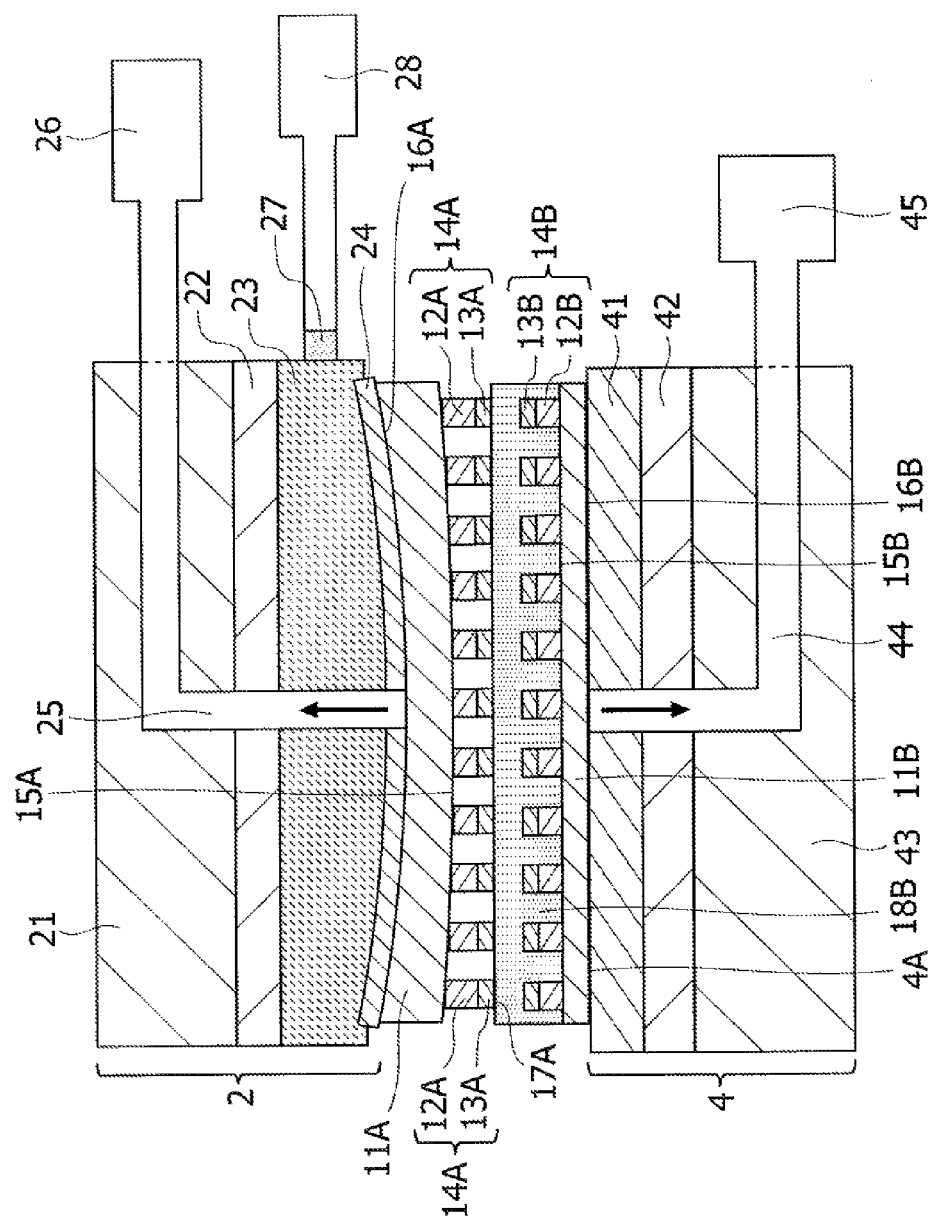
FIG. 10 is a process diagram of a method for manufacturing a laminated chip.
Figure 11:
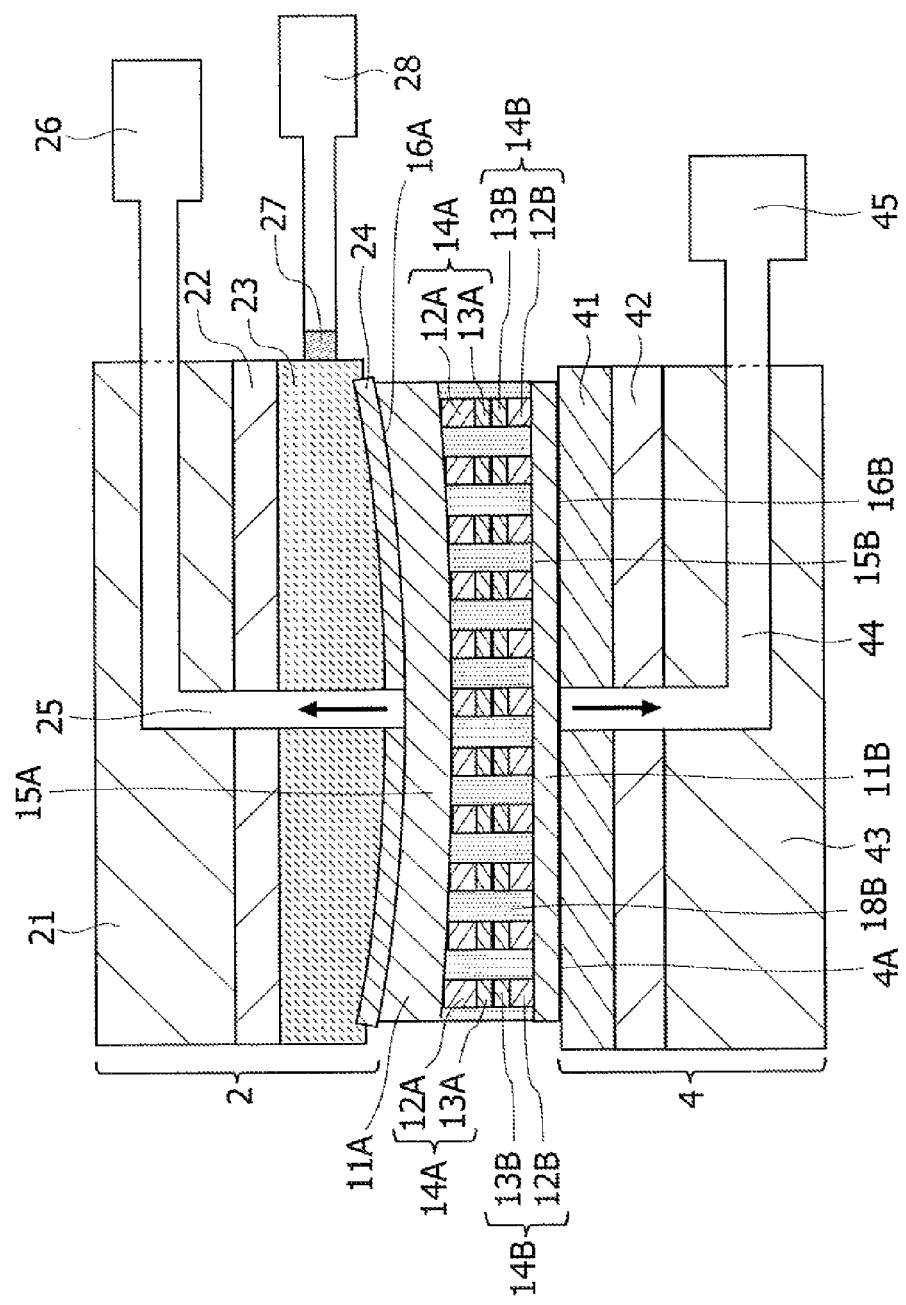
FIG. 11 is a process diagram of a method for manufacturing a laminated chip.
Figure 12:
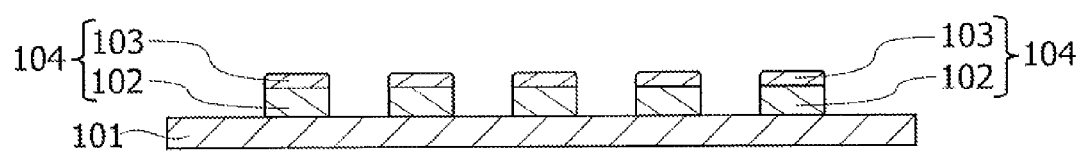
FIG. 12 is an explanatory view of a method for joining semiconductor chips.
Figure 13:
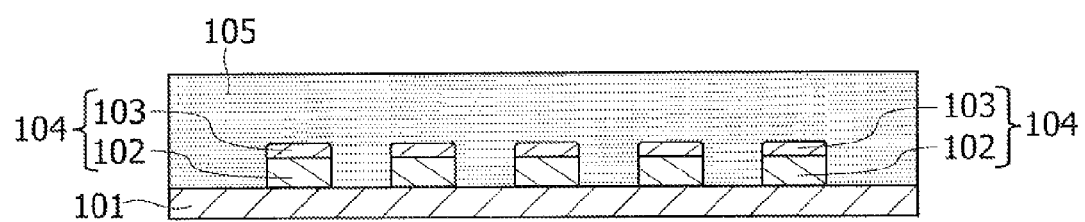
FIG. 13 is an explanatory view of a method for joining semiconductor chips.

In the structural examples of the holding stage 4 illustrated in FIGS. 9 and 10, the holding stage 4 includes one suction hole 44. The holding stage 4 is not limited to the structural examples of the holding stage 4 illustrated in FIGS. 9 and 10, however. The holding stage 4 may include a plurality of suction holes 44. In this case, each of the plurality of suction holes 44 is connected to the suction unit 45. For example, at least one suction hole 44 located in the central portion of the holding stage 4 may suck the central portion of the semiconductor chip 11B, and at least one suction hole 44 located in the outer peripheral portion of the holding stage 4 may suck the outer peripheral portion of the semiconductor chip 11B. In the structural examples of the holding stage 4 illustrated in FIGS. 9 and 10, the suction unit 45 is disposed externally to the holding stage 4. The holding stage 4 is not limited to the structural examples illustrated in FIGS. 9 and 10, however. The suction unit 45 may be disposed inside the holding stage 4. Accordingly, the holding stage 4 may include the suction unit 45.

According to the semiconductor mounting apparatus 1 in accordance with the embodiments, the amount of liquid or gas filled in the diaphragm 23 is adjusted to cause the diaphragm 23 and the elastic body 24 to deform according to the shape of the back surface 16A of the semiconductor chip 11A. That is, the diaphragm 23 and the elastic body 24 vary in shape in conformity with the shape of the back surface 16A of the semiconductor chip 11A. Thus, the elastic body 24 and the back surface 16A of the semiconductor chip 11A come into close contact with each other. As a result, an even pressure can be applied to the semiconductor chip 11A when the head 2 performs a pressurization treatment on the semiconductor chip 11A.

According to the semiconductor mounting apparatus 1 in accordance with the embodiments, a pressurization treatment can be performed on the semiconductor chip 11A with the upper surfaces 17A of the plurality of terminals 14A of the semiconductor chip 11A aligned parallel to one another. Consequently, even when a thickness variation, a height variation, and warpage are present in the semiconductor chip 11A, the terminals 14A, and the semiconductor chip 11A, respectively, all of the plurality of terminals 14A of the semiconductor chip 11A can be joined to the plurality of terminals 14B of the semiconductor chip 11B. As described above, according to the semiconductor mounting apparatus 1 in accordance with the embodiments, the thickness variation of the semiconductor chip 11A, the height variation of the terminals 14A, and the warpage of the semiconductor chip 11A can be absorbed by aligning the upper surfaces 17A of the plurality of terminals 14A of the semiconductor chip 11A parallel to one another.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor mounting apparatus comprising:
    a storing unit that stores a liquid or a gas and that deforms according to an amount of the liquid or the qas stored in the storing unit;
    a contact unit that deforms according to a deformation of the storing unit; and
    a sucking unit that sucks up the semiconductor chip to bring the semiconductor chip into close contact with the contact unit.

2. The semiconductor mounting apparatus according to claim 1,
    wherein the semiconductor chip includes a plurality of terminals, a terminal-formed surface on which the plurality of terminals are formed, and an opposite surface on the opposite side of the terminal-formed surface, and
    the opposite surface has close contact with the contact unit under the condition of the contact unit being deformed according to the shape of the opposite surface.

3. The semiconductor mounting apparatus according to claim 2, wherein the contact unit deforms into a concave circular-arc shape or a convex circular-arc shape in conformity with the opposite surface.

4. The semiconductor mounting apparatus according to claim 1, comprising:
    a suction unit that sucks the semiconductor chip from a terminal-formed surface side of the semiconductor chip on which a plurality of terminals are formed, to align the upper surfaces of the plurality of terminals parallel to one another.

5. The semiconductor mounting apparatus according to claim 1, comprising:
    a heating stage on which a second semiconductor chip opposed to the semiconductor chip is mounted, and which heats the second semiconductor chip.

6. A head of a semiconductor mounting apparatus comprising:
    a storing unit that stores a liquid or a gas and that deforms according to an amount of the liquid or the gas stored in the storing unit;
    a contact unit that deforms according to a deformation of the storing unit; and
    a sucking unit that sucks up the semiconductor chip to bring the semiconductor chip into close contact with the contact unit.

7. The head of the semiconductor mounting apparatus according to claim 6, wherein
    the semiconductor chip includes a plurality of terminals, a terminal-formed surface on which the plurality of terminals are formed, and an opposite surface on the opposite side of the terminal-formed surface, and
    the opposite surface has close contact with the contact unit under the condition of the contact unit being deformed according to the shape of the opposite surface.

8. The head of the semiconductor mounting apparatus according to claim 7, wherein the contact unit deforms into a concave circular-arc shape or a convex circular-arc shape in conformity with the opposite surface.

* * * * *